United States Patent [19]

Roessler et al.

[11] Patent Number: 4,820,998

[45] Date of Patent: Apr. 11, 1989

[54] OPERATIONAL AMPLIFIER

[75] Inventors: Bernward Roessler; Eberhard Wolter, both of Munich, Fed. Rep. of Germany

[73] Assignee: Siemens Aktiengesellschaft, Berlin and Munich, Fed. Rep. of Germany

[21] Appl. No.: 100,692

[22] Filed: Sep. 24, 1987

[30] Foreign Application Priority Data

Sep. 26, 1986 [DE] Fed. Rep. of Germany ....... 3632802

[51] Int. Cl.[4] .............................................. H03F 3/45
[52] U.S. Cl. .................................... 330/258; 330/253
[58] Field of Search ............... 330/252, 253, 255, 258, 330/277, 311

[56] References Cited

U.S. PATENT DOCUMENTS 4,656,437 4/1987 Saari .............................. 330/258 X

OTHER PUBLICATIONS

"A High-Performance Micropower Switched-Capacitor Filter", Castello et al., IEEE Journal of Solid-State Circuits, vol. SC-20, No. 6, Dec. 1985, pp. 1122-1132.
"CMOS Video Filters Using Switched Capacitor 14-MHz Circuits", Matsui et al., IEEE Journal of Solid-State Circuits, vol. SC-20, No. 6, Dec. 1985, pp. 1096-1102.
"80 MHz Low Offset CMOS Fully Differential and Single-Ended OP Amps", Ribner et al., IEEE 1985 Custom Integrated Circuits Conference, pp. 174-177.
"Power-Supply Rejection in Differential Switched-Capacitor Filters", De La Plaza et al. IEEE J. S. S. Circuits, vol. SC-19, No. 6, Dec. 1984, pp. 912-918.
"Precision Analog Components", Choi et al., IEEE International Solid-State Circuits Conference 1983, pp. 246, 247 and 314.
"A Family of Differential NMOS Analog Circuits for a PCM Codec Filter Chip", Senderowicz et al., IEEE Journal of Solid-State Circuits, vol. SC-17, No. 6, Dec. 1982.

Primary Examiner—Steven Mottola
Attorney, Agent, or Firm—David N. Caracappa

[57] ABSTRACT

An operational amplifier of the folded-cascode type with: push-pull output terminals; a differential-input transistors; a load impedance in the form of a cascode current source coupled to the differential-input, and a dynamic common-mode negative feedback. A current source transistor in the cascode current source is incorporated into the dynamic common-mode negative feedback.

6 Claims, 4 Drawing Sheets

OPERATIONAL AMPLIFIER

The invention concerns an improved operational amplifier of the folded-cascode type with push-pull output terminals.

The properties of integrated circuits in which signals are analog-processed by means of operational amplifiers are improved when the amplifiers have symmetrical push-pull output terminals. Amplifiers of this type operate better than those with only one output terminal, for example, in relation to coupling in of interference voltages, signal-to-noise ratio, and nonlinearities of the even order. Amplifiers with symmetrical push-pull output terminals require common-mode negative feedback to ensure that the average voltage between the output terminals remains constant in terms of a reference. Two forms of common-mode negative feedback arrangements are dynamic and static common-mode negative feedback. The advantage of dynamic common-mode negative feedback is that it neither diminishes the control range nor increases the nonlinearities of the amplifier characteristic. However, dynamic common-mode negative feedback has heretofore been employed only in amplifiers appropriate for signal frequencies in the voice-frequency range. (See, for example, [1]: IEEE Journal of Solid-State Circuits, Vol. SC-17, No. 6, December 1982, pp. 1014–23; and [2]: IEEE Journal of Solid-State Circuits, Vol. SC-20, No. 6, December 1985, pp. 1122–32). Single-stage amplifiers of the folded-cascode type with push-pull output terminals have been previously employed for analog signal processing at higher frequencies. (See, for example, [3]: IEEE International Solid-State Circuits Conference, 1983, pp. 246, 247 and 314; [4]: IEEE Journal of Solid-State Circuits, Vol. SC-20, No. 6, December 1985, pp. 1096–1102; and [5]: IEEE 1985 Custom Integrated Circuits Conference, pp. 174–77).

Static common-mode negative feedback in a folded-cascode amplifiers, as described in FIG. 2 of [3] and FIG. 2 of [4] occurs through field effect transistors M11 and M12. These transistors operate in the triode range and channel current through an amplifier load impedance, in the form of cascode current sources, by varying the source potential. The amplifier's control range is diminished by the static common-mode negative feedback to an extent equal to the M11 and M12 source-drain voltage.

Static common-mode negative feedback in an amplifier known from IEEE Journal of Solid-State Circuits, Vol. SC-19, No. 6, December 1984, pp. 912–918 (FIG. 4) results from varying the current in input transistors M1 and M2. However, an additional current path is needed for transistors M13 to M20, increasing the power demand of the amplifier. Another drawback to this known amplifier is that the average DC voltage between the amplifier output terminals depends on the voltages applied to transistors M13 and M14 or M17 and M18. This means that the control range depends on the tolerances of component values.

Static common-mode negative feedback occurs in the amplifier disclosed in [5] through the upper cascode current source by varying the gate potential of transistors M4 and M5. This requires two additional current paths with transistors M12 to M19, which increases the amplifier's power consumption. In addition, transistor M18 or M19 no longer functions in saturation at the overload levels. This diminishes the amplifier's useful control range.

The amplifier disclosed in FIG. 9 of [2] features dynamic common-mode negative feedback with three current paths that increase the amplifier's power consumption. The change in the drain current of transistors M1, M2, M4 and M5 with their drain-source voltage decreases the components amplification.

The object of the present invention is to provide an operational amplifier having dynamic common-mode feedback without the disadvantages described above, and with simpler circuitry.

This object is attained in accordance with principles of the present invention in an operational amplifier as described above, in which the current source transistors in the cascode current source are incorporated into the dynamic common-mode negative feedback circuit.

An advantage of the invention is that, because the current transistor in each cascode current source is used both as a load impedance in a differential amplifier and as a common-mode signal amplifier, neither additional current paths nor transistors wired in series with the load impedances are required.

Additional differential-input transistors, that may be used for offset compensation are preferably wired in parallel with the aforesaid differential-input transistors.

In practice, field-effect transistors are employed in the operational amplifier.

The invention will now be described by way of examples with reference to the drawings, wherein.

Figure 1:
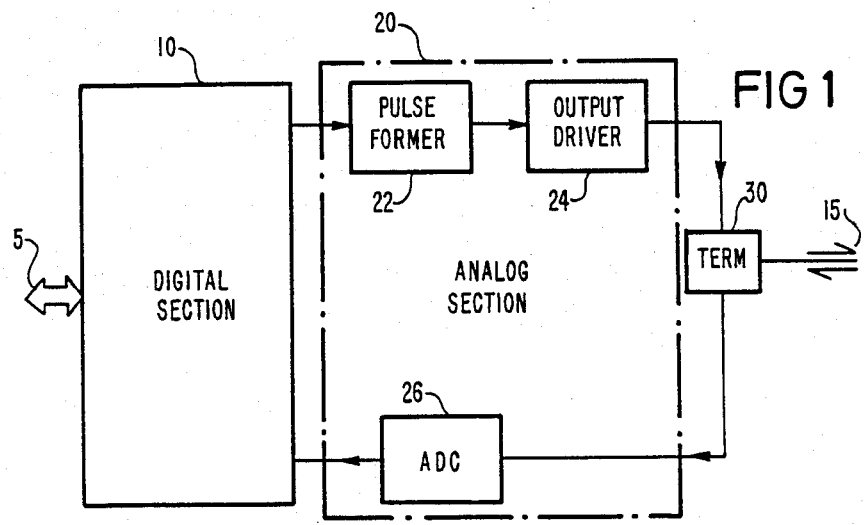
FIG. 1 illustrates a block diagram of data-transmission equipment that employs an operational amplifier in accordance with the present invention.

FIG. 1 illustrates data-transmission equipment for the duplex transmission of digital signals in the duplex-channel system over a two-wire line 15. The data-transmission equipment can for example be connected to transmission equipment in a central office (not shown) via this line 15. The data-transmission equipment is also connected to a data terminal (not shown) via a four-wire line 5. The data-transmission equipment consists of a digital section 10 and an analog section 20. The digital section 10 can receive binary signals from the data terminal via the four-wire line 5 for transmission over the two-wire line 15 and can convert them into three-level signals. The three-level signals can be coded, for example, in accordance with an AMI or 4B-3T block code. Subsequent to code conversion, the digital section 20 conveys the signals to a pulse former 22 that is part of the analog section 20 of the data-transmission equipment. In another version, the digital section 10 supplies information in a binary coded form representing the three-level signals that are to be constructed to the pulse former 22. As will be described later herein, the pulse former 22 converts the signals that have been supplied to it into approximately analog signals and then forwards them to an output driver 24. The output driver 24 amplifies the signals shaped by the pulse former 22. The amplified signals at the output terminal of the output driver 24, in the form of output information signals for the aforesaid two-wire line 15, are supplied to a terminating circuit 30.

Signals that occur in the aforesaid two-wire line 15 in the form of input information signals are picked up by the terminating circuit 30 and supplied to an analog-to-digital converter (ADC) 26. In addition to input information signals, the terminating circuit 30 also receives interference signals called echo signals and passes them to the analog-to-digital converter 26. Echo signals occur either directly in terminating circuit 30 due to the transmission paths being incompletely isolated, or due to reflections in the two-wire line while the output information signals are being transmitted. Thus, the analog-to-digital converter 26 receives not only the actual input information signals but mixed signals composed of the input information signals and the echo signals.

The mixed information and echo signals occuring in digital form at the output terminal of the analog-to-digital converter 26 are accepted by the digital section 10 of the data-transmission equipment illustrated in FIG. 1. The digital section 10 has an echo compensator (not shown) that separates the input information signals received in digital form by the analog-to-digital converter 20 from the echo signals that occur along with them. The input information signals, which have now been separated from the echo signals and are in the form of three-level signals, are recoded into binary signals in the digital section 10 and forwarded to the aforesaid data terminal over the four-wire line 5.

Only the pulse former 22 in the data-transmission equipment illustrated in FIG. 1 will now be described. The other elements illustrated in FIG. 1 have long been known, and their function does not require specification.

Some of the demands that the pulse former 22 has to comply with will now be described before its design is described. As previously mentioned herein, the binary signals from the data terminal meant for transmission over the two-wire line 15 may be first converted into three-level signals. Three-level signals of this type comprise pulses representing logical levels +1, 0, and −1. To make it possible to employ the same coefficient for pulses representing both +1 and −1 in the echo compensator, independent of mathematical sign, the amplitude and shape of the +1 and −1 pulses as reshaped by the pulse former 22 must be as congruent in shape as possible. A $\sin^2$ shape is generally preferred to comply with interference-signal radiation standards in trunk branches for +1 and −1 representative pulses. Because these $\sin^2$-shaped pulses are 13/8 longer than the width of the binary signals from the data terminal, two pulses will always overlap when a data sequence +1 +1, −1 −1, or +1 −1, for example, is transmitted. The combining of these pulses must be strictly linear in the pulse former 22 so that the echo compensation for each pulse in the three-level signal can be carried out separately.

Figure 2:
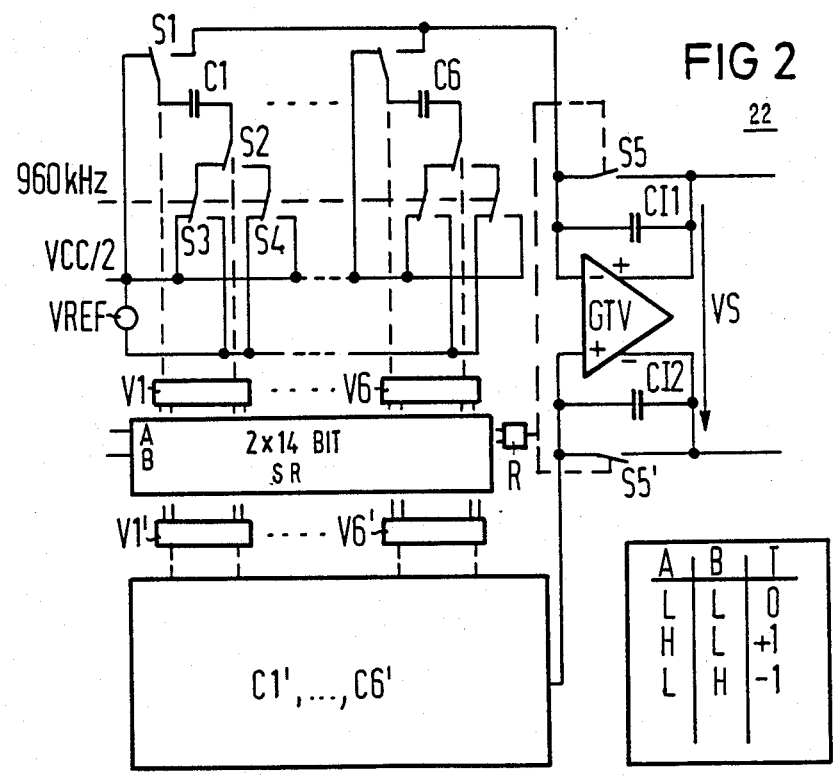
FIG. 2 illustrates a diagram, partially in block form, and partially in schematic form, of the design of the pulse former in FIG. 1.

FIG. 2 illustrates the design of the aforesaid pulse former 22 in greater detail. The pulse former 22 generates pulses which approximate the preferred $\sin^2$ shape for the pulses by forming pulses having a staircase-shaped curve. The individual pulses, which can occur at a transmission rate of 120 kHz, all have periods of 13 cycles of a 960 kHz clock. The pulses are shaped by means of charge redistribution among switched charge-accumulating capacitors labeled C1 to C6 in FIG. 2 and a summing capacitor CI1 that is coupled between the − input terminal and the + output terminal of a push-pull operational amplifier GTV. Each of these charge-accumulating capacitors is connected to a circuit that has four switches S1 to S4.

All of the charge-accumulating capacitors are identically connected to their associated circuits. FIG. 2 illustrates how charge-accumulating capacitor C1 is connected to its associated circuit. Switch S1 connects one of the terminals of charge-accumulating capacitor C1 either to the terminal of summing capacitor CI1 that is connected to the − input terminal of push-pull operational amplifier GTV, or to a voltage VCC/2, as desired. Switch S2 is connected to the other terminal of charge-accumulating capacitor C1 and to either VCC/2 or a source of reference voltage VREF as desired through switches S3 and S4. Switches S3 and S4 are controlled by synchronization signals having a frequency of 960 kHz. Switches S1 and S2 are, on the other hand, connected through a logic circuit V1 to prescribed stages in a shift-register system SR. The other charge-accumulating capacitors C2 through C6 are, like charge-accumulating capacitor C1, each connected to its associated circuit. The logic circuit associated with charge-accumulating capacitor C6, for example, is labeled V6 in FIG. 2.

The aforesaid shift-register system SR consists of two 14-bit shift registers A and B. The three-level signals supplied to the pulse former 22 at a transmission rate of 120 kHz are binary-coded and latched at one edge of a 120-kHz clock pulse in shift registers A and B. FIG. 2 illustrates the truth table that determines the binary coding. Column T contains the logic levels +1, 0, and −1 for the three-level signals. Columns A and B contain binary logic levels corresponding to the three-level logic levels represented by the binary signals supplied to shift registers A and B.

The binary signals constructed in accordance with the truth table travel through the individual stages of the shift register at a rate of 960 kHz. The two shift registers are provided with a 960-kHz clock signal (not shown) for that purpose. The logic circuits V1 to V6, associated with the aforesaid charge-accumulation capacitors C1 to C6, are connected to prescribed stages in the shift registers SR.

Also connected to shift registers SR is another logic circuit labeled R, in FIG. 2. This circuit controls a switch S3 that short-circuits the aforesaid summing capacitor CI1 in response to appropriate activation from logic circuit R.

The pulse former 22 illustrated in FIG. 2 has, in addition to the aforesaid charge-accumulation capacitors C1 to C6, charge-accumulation capacitors C1' to C6' (illustrated in a single block) that, like charge-accumulation capacitors C1 to C6, are each connected to a circuit consisting of four switches (not shown). These switching circuits are each connected to specific stages in shift registers A and B through logic circuits labeled V1' to V6' in FIG. 2. Charge-accumulation capacitors C1' to C6' are otherwise identical to charge-accumulation capacitors C1 to C6, respectively.

Also provided is another summing capacitor CI2 that can be connected to charge-accumulation capacitors C1' to C6' through the last-mentioned switching circuits. Summing capacitor CI2 is positioned between the + input terminal and the − output terminal of the aforesaid push-pull operational amplifier GTV. In parallel with this summing capacitor is a switch S5'. This switch short-circuits summing capacitor CI2 in response to a signal from the aforesaid logic circuit R.

How the pulse former 22 illustrated in FIG. 2 operates in conjunction with charge-accumulation capacitors C1 to C6 and summing capacitor CI1 will now be described. As previously mentioned herein, the pulse former 22 obtains three-level pulses at a rate of 120 kHz which are binary-coded in accordance with the truth table in FIG. 2. Samples of these binary-coded signals are picked up in 14-bit shift registers A and B by means of a 120-kHz clock signal. The individual binary-coded samples then travel through the stages in the shift registers at a transmission rate of 960 kHz, so that signals corresponding to the binary coded samples will appear sequentially at the output terminals of the successive stages. The sequential occurrence of the signals establishes 13 960-kHz periods for each binary-coded sample and hence for each output pulse.

The output pulses are reshaped during the 13 periods into a staircase-shaped signal of 13 periods. This staircase-shaped signal is shaped approximately like a $\sin^2$-shaped signal. The pulses are shaped by charge redistribution among the charge-accumulation capacitors C1 to C6 and summing capacitor CI1. The output voltage VS at the + output terminal of push-pull operational amplifier GTV will increase or decrease depending on the direction of the charge-redistribution current. Charge-accumulation capacitor C1 may, for example, first be charged to reference voltage VREF. The charge may then be transferred to summing capacitor CI1. A voltage change of $VS = C1/CI1 \cdot VREF$ will, thus, appear at the output terminal of operational amplifier GTV. If, on the other hand, charge-accumulation capacitor C1 is first discharged and then has one of its contacts connected to summing capacitor CI1 and its other contact to the source of reference voltage VREF, then the charge-accumulation capacitor C1 will be charged from summing capacitor CI1, (thereby discharging summing capacitor CI1) establishing a voltage change of $VS = C1/CI1 \cdot VREF$ at the output terminal of operational amplifier GTV. The other charge-accumulation capacitors can similarly release charge to or accept charge from summing capacitor CI1.

Figure 3A:
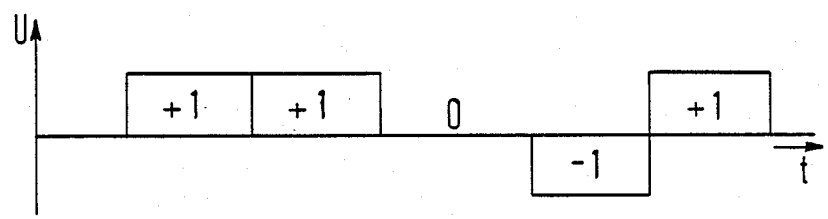
FIG. 3 illustrates waveform diagrams that will be referred to during the course of the description.

FIG. 3a illustrates a sequence of three-level pulses that are to be reshaped by the pulse former 22. The particular example employed is the sequence +1, +1, 0, −1, +1. Graph 3b, on the other hand, illustrates the sequence of output pulses that appear at the output terminal of operational amplifier GTV. As previously mentioned herein, the individual output pulses in this sequence are 13/8 wider than the three-level pulses supplied to the pulse former 22. The aforesaid 960-kHz periods are plotted along the abscissa of graph 3b and the output voltage VS that appears at the output terminal of push-pull operational amplifier GTV are plotted along the coordinate. The arrow graph in FIG. 3c illustrates the sequence in which charge-accumulation capacitors C1 to C6 become active in shaping the output pulses. Positive voltage changes are represented by arrows pointing up and negative voltage changes by arrows pointing down. The distribution of the capacitance values of charge-accumulation capacitors C1 through C6 is established by adapting the individual voltage changes to the $\sin^2$ shape.

When a +1 output pulse is generated, charge-accumulation capacitor C1 is first charged to reference voltage VREF during the first 960-kHz period (when the binary-coded sample representing the +1 three-level pulse in the first cell of shift-register system A and B) by an appropriate action carried out by the switching circuit associated with charge-accumulation capacitor C1. The charge is then transferred to summing capacitor CI1, and charge-accumulation capacitor C1 is disconnected. The result is a positive-going change in the voltage VS at the output terminal of push-pull operational amplifier GTV. In the second through sixth periods (with the binary-coded sample traveling through cells 2 through 6 of the shift-register system SR) the same process occurs in relation to charge-accumulation capacitors C2 through C6. During the sixth period, accordingly, the maximum voltage VS will be attained at the output terminal of operational amplifier GTV. From the ninth to the 14th period, charge-accumulation capacitor C1 will initially be discharged. One of its terminals will then be connected to summing capacitor CI1 and the other to the source of reference voltage VREF. Charge-accumulation capacitor C1 will accordingly be charged by the summing capacitor CI1 (thereby discharging summing capacitor CI1) and a negative-going change in the output voltage VS will occur at operational amplifier GTV. In periods 10 through 14 the same process will occur in relation to charge-accumulation capacitors C2 through C6. Thus, each charge-accumulation capacitor is involved twice in generating a +1 output pulse.

When a −1 output pulse is generated, charge-accumulation capacitor C1 is first discharged and then charged by summing capacitor CI1 during the first period. The same process occurs in the subsequent periods in relation to charge-accumulation capacitors C2 through C6. The processes of charging and discharging summing capacitor CI1 are, thus, the reverse of what occurs in relation to generating a +1 output pulse. Because the same reference voltage VREF and the same charge-accumulation capacitors are employed for both +1 and −1 output pulses, the shape and the amplitude of the +1 and −1 output pulses are independent of the capacitance value relationships, and are congruent, when using an offset-free operational amplifier GTV.

Figure 3B:
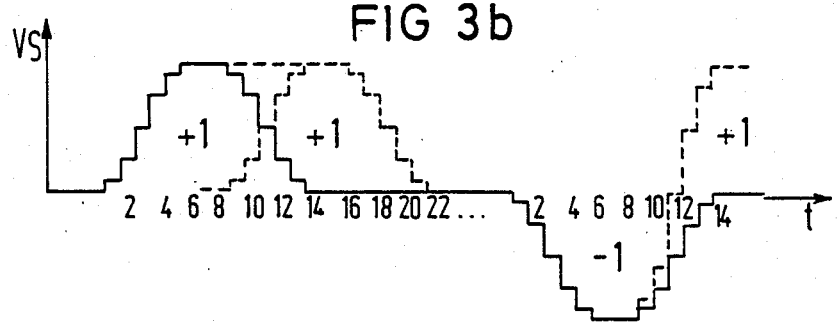
Figure 3C:
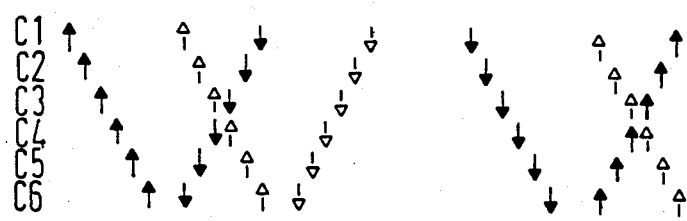

It will be evident from FIG. 3b that, for the output-pulse sequence +1, +1 and −1, +1, there will always be an overlap between two adjoining output pulses in the 9th to 13th periods of the first pulse. Referring to the pulse sequence +1 +1 in FIG. 3b, charge-accumulation capacitor C6 will for example be charged by summing capacitor CI1 during the 9th period of the first pulse in the same manner as when a single isolated output pulse is generated. A charge will, however, simultaneously be transferred from charge-accumulation capacitor C1 to summing capacitor CI1. Because, when the output pulses overlap, the same charge-accumulation capacitors participate as when the output pulses occur individually, the overlap will be linear and independent of capacitance value tolerances.

When the output signal should have a zero value, e.g. in the 14th period during a single output pulse or in the 12th period of a change from +1 to −1 or from −1 to +1 the summing capacitor will be short-circuited—i.e. discharged—during the earliest possible period in which the output voltage at operational amplifier GTV is nominally 0. Switch S5 will accordingly receive a corresponding resetting signal from logic circuit R. The discharging of summing capacitor CI1 will eliminate previous summation errors as the result of a final amplification or offset voltage on the part of operational amplifier GTV.

The operation of the pulse former 22 illustrated in FIG. 2 has now been described with reference to the graphs in FIG. 3 only in relation to charge-accumulation capacitor C1 to C6 and to summing capacitor CI1. Charge-accumulation capacitors C1' to C6' and summing capacitor CI2 are similarly involved in the generation of output pulse sequences. In this case output pulses that are the inverse of the output pulses at the + output terminal in terms of a reference voltage (e.g. VCC/2) appear at the − output terminal of operational amplifier GTV.

One reason for using a push-pull operational amplifier for amplifier GTV, is to minimize nonlinearities in the output signals that affect the shape and the amplitude of the +1 and −1 output pulses. A push-pull operational amplifier minimizes the coupling in of interference voltages and improves the signal-to-noise ratio. The offset voltage of push-pull operational amplifier GTV is decreased by means of a compensation circuit. Offset compensation, which is carried out while the summing capacitors CI1 and CI2 of pulse former 22 are being reset, minimizes the contributions of the 1/f transistor noise in push-pull operational amplifier GTV.

Figure 4:
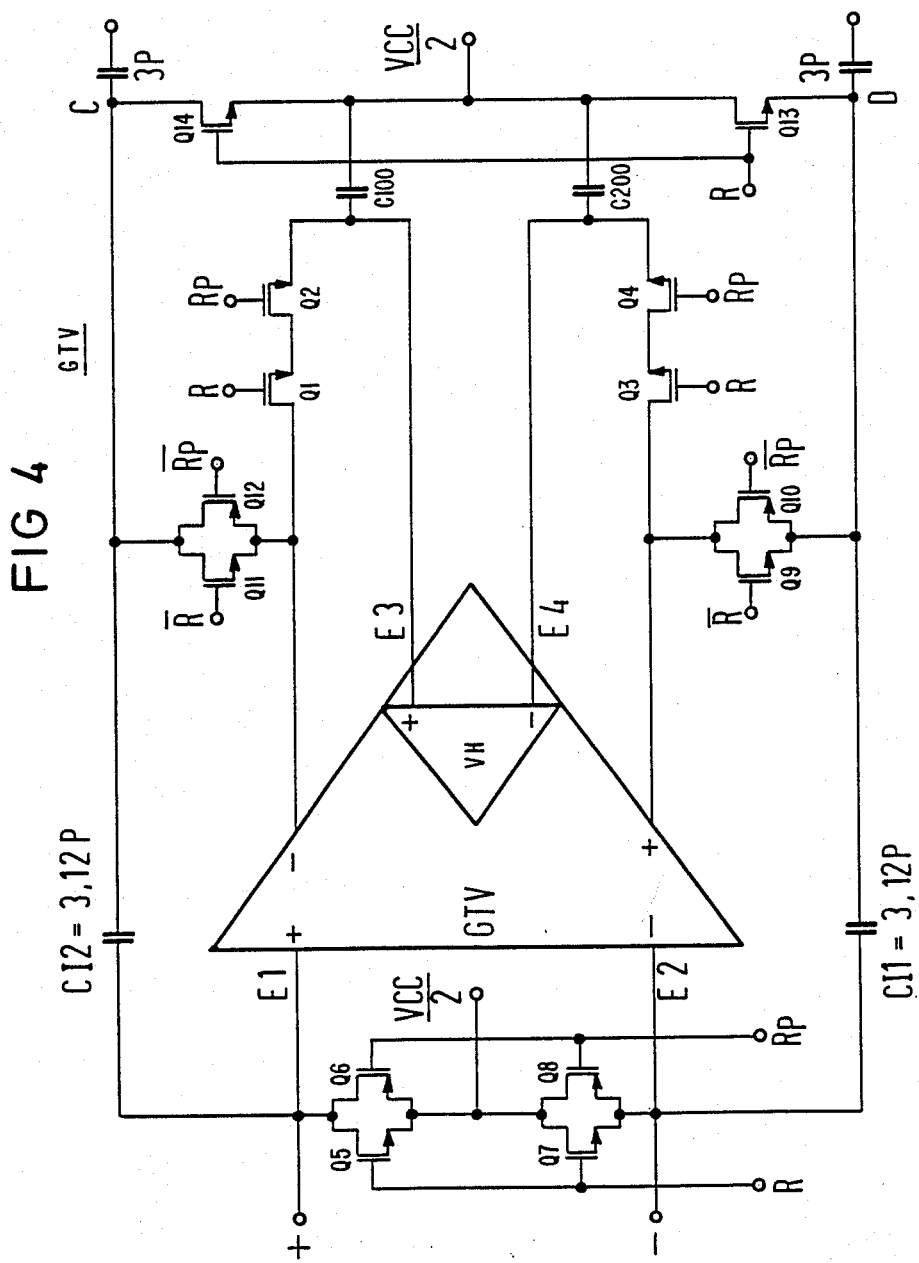
FIG. 4 illustrates a diagram, partially in block form and partially in schematic form, showing how the operational amplifier illustrated in FIG. 2 is wired for offset compensation.

FIG. 4 illustrates how the operational amplifier is wired for offset compensation. In FIG. 4, the + and − input terminals of push-pull operational amplifier GTV as illustrated in FIG. 2, are labeled E1 and E2, respectively. In addition, operational amplifier GTV further includes two auxiliary input terminals E3 and E4. During the resetting phase, that is, while a reset signal is being generated by the logic circuit R illustrated in FIG. 2, auxiliary input terminal E3 is connected to the − output terminal of operational amplifier GTV. Auxiliary input terminal E4 is similarly connected to the + output terminal of the operational amplifier during the resetting phase. These connections are established by rendering transistors Q1, Q2, Q3 and Q4 conductive between the auxiliary input terminals and said operational-amplifier output terminals during a reset signal. Also connected between the input terminals E1 and E2 of push-pull operational amplifier GTV is a first pair of parallel-connected transistors Q5 and Q6 connected in series with a second pair of parallel-connected transistors Q7 and Q8. The junction between the pairs of parallel-connected transistors is connected to VCC/2. Since the transistors composing the series circuit are activated when a reset signal occurs, the same voltage will be present at output terminals E1 and E2 during the resetting phase and hence during offset compensation.

Summing capacitor CI1 is connected to the + output terminal of operational amplifier GTV through parallel-connected transistors Q9 and Q10 and summing capacitor CI2 is connected to the − output terminal of operational amplifier GTV through parallel-connected transistors Q11 and Q12. Because the parallel transistors are non-conductive during the resetting phase, the summing capacitors are disconnected from the operational-amplifier output terminals during offset compensation. The summing-capacitor terminals that are connected to the parallel transistors, are connected to VCC/2 over separate transistors: Q13 for summing capacitor CI1, and Q14 for summing capacitor CI2. Because the summing-capacitor terminals that are connected to the operational-amplifier input terminals are also connected to VCC/2 at this time, both summing capacitors will be discharged.

The offset compensation carried out during the resetting phase produces an equilibrium resulting in a reduction in the offset voltage at output terminals + and − by a factor of VH. The amplification VH from auxiliary input terminals E3 and E4 to the amplifier output terminals is about 100. The control voltages at the auxiliary input terminals are stored in two capacitors C100 and C200 and is accordingly active even while the output pulses are being shaped.

Figure 5:
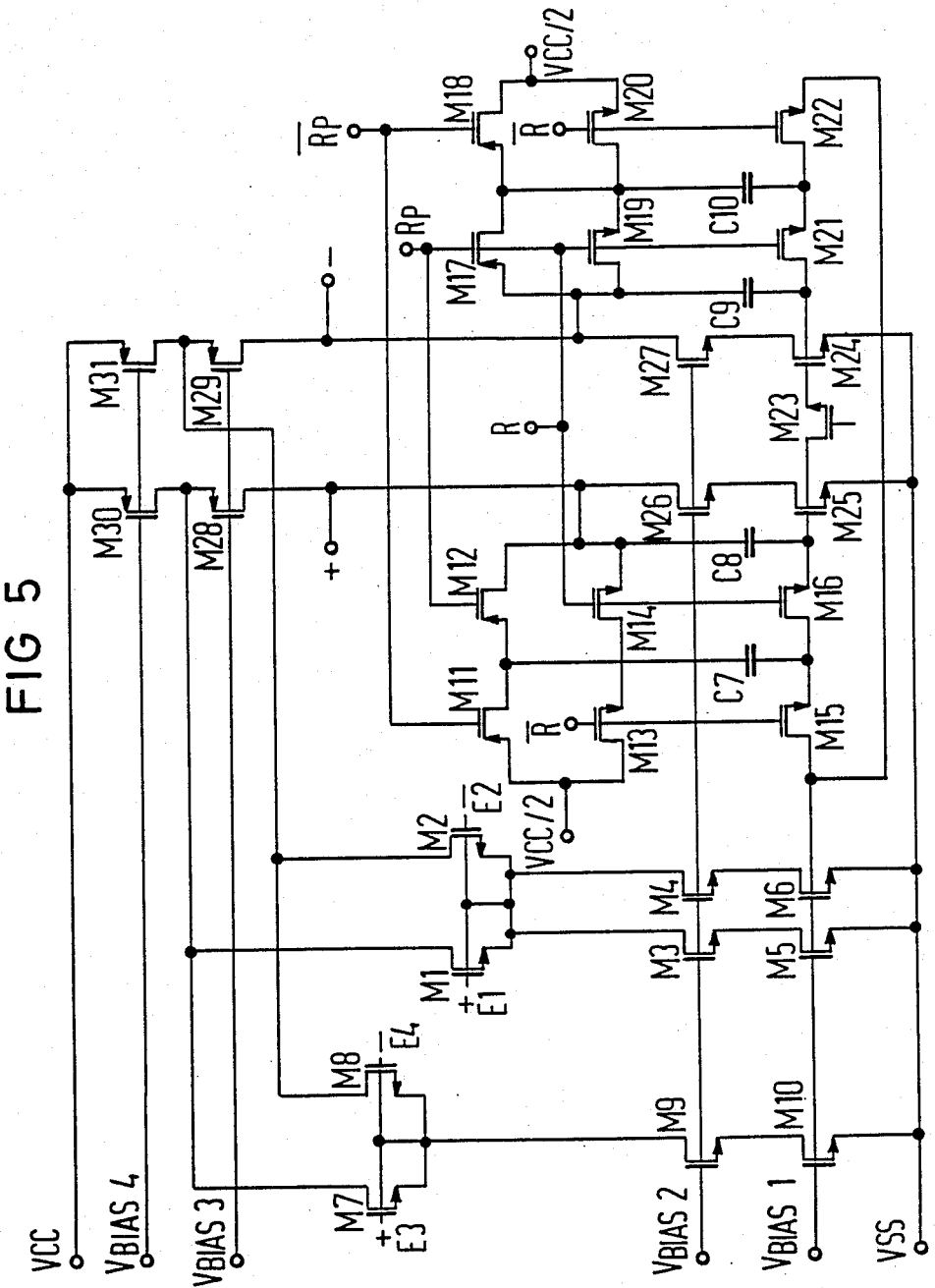
FIG. 5 illustrates a schematic diagram of the design of the operational amplifier illustrated in FIG. 2.

FIG. 5 illustrates the design of an operational amplifier GTV composed of field-effect transistors. This operational amplifier has two parallel current paths, each consisting of a series circuit of four current sources in the form of transistors. The transistors that compose the series circuits are labeled M25, M26, M28, and M30 and M24, M27, M29, and M31, respectively, in FIG. 5. The junction between transistor M26 and M28 constitutes the + output terminal and the junction between transistors M27 and M29 the − output terminal of operational amplifier GTV.

This operational amplifier also has two parallel differential input transistor systems. Each system consists of a differential transistor stage M1 and M2 and M7 and M8 in series with a corresponding current-source system. The current-source system wired in series with differential transistor stage M1 and M2 is a parallel circuit of two series-wired transistors. The series-wired transistors are labeled M3 and M5 and M4 and M6. The current-source system connected to differential transistor stage M7 and M8 on the other hand is a single series circuit comprising transistors M9 and M10.

The gate electrode of transistor M1 is coupled to input terminal E1, the gate electrode of transistor M2 is coupled to input terminal E2, the gate electrode of transistor M7 is coupled to input terminal E3, and the gate electrode of transistor M8 is coupled to input terminal E4.

The drain electrodes of both transistors M1 and M7 are connected to the junction between the aforesaid transistors M28 and M30. The drain electrodes of both transistors M2 and M8 are connected to the junction between transistors M29 and M31.

The aforesaid transistors M1 through M10 and M24 through M31 constitute a differential folded-cascode amplifier. Transistors M24 through M31 accordingly constitute load impedances for the aforesaid differential-transistors systems.

The operational amplifier illustrated in FIG. 5 also has a dynamic common-mode negative-feedback system consisting of transistors M11 through M23 and of capacitors C7 through C10. The gate electrode of transistor M25 is connected to the + output terminal of the operational amplifier through transistor M11 through M16 and through capacitors C7 and C8. Transistors M17 through M22 and capacitors C9 and C10 connect the gate electrode of transistor M24 to the − output terminal of the operational amplifier. The current source transistors M24 and M25 of the cascode current sources, accordingly, are components of both the cascode current sources that constitute the load impedances in the differential-transistor systems, and of the aforesaid common-mode negative-feedback system.

It should be noted, finally, that, although the operational amplifier in accordance with the instant invention has been described with references to a pulse former, it can be employed generally in any device requiring push-pull output terminals and a high demand for low interference-voltage in-coupling—for example, signal-processing equipment with switched capacitors.

We claim:

1. An operational amplifier of the folded-cascode type, comprising:
   push-pull output terminals;
   differential-input transistors;
   a load impedance in the form of a cascode current source coupled to said differential-input transistors; and
   a switched capacitor common-mode negative feedback circuit; wherein:
   a single transistor both operates as a current source transistor in said cascode current source and also is incorporated into said switched capacitor common-mode negative feedback circuit.

2. An operational amplifier of the folded-cascode type, comprising:
   push-pull output terminals;
   first differential-input transistors;
   a load impedance in the form of a cascode current source coupled to said differential-input transistors;
   offset compensation differential-input transistors, coupled in parallel with said first differential-input transistors; and
   a dynamic common-mode negative feedback; wherein:
   a current source transistor in said cascode current source is incorporated into said dynamic common-mode negative feedback.

3. The operational amplifier of claim 2, wherein all of the transistors are field-effect transistors.

4. The operational amplifier of claim 1, wherein all of the transistors are field-effect transistors.

5. The operational amplifier of claim 1, further comprising offset compensation differential-input transistors, coupled in parallel with said first-mentioned differential-input transistors.

6. The operational amplifier of claim 5, wherein said offset compensation differential-input transistors are field-effect transistors.

* * * * *